(12) United States Patent
You et al.

(10) Patent No.: US 9,941,281 B2
(45) Date of Patent: Apr. 10, 2018

(54) SEMICONDUCTOR DEVICE

(71) Applicant: SAMSUNG ELECTRONICS CO., LTD., Suwon-si, Gyeonggi-do (KR)

(72) Inventors: Jung-Gun You, Ansan-si (KR); Hyung-Jong Lee, Osan-si (KR); Sung-Min Kim, Daegu (KR); Chong-Kwang Chang, Bucheon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/409,033

(22) Filed: Jan. 18, 2017

(65) Prior Publication Data

US 2017/0133370 A1    May 11, 2017

Related U.S. Application Data

(63) Continuation of application No. 14/995,457, filed on Jan. 14, 2016, now Pat. No. 9,553,089.

(30) Foreign Application Priority Data

Apr. 2, 2015 (KR) .................. 10-2015-0046761

(51) Int. Cl.
*H01L 27/088* (2006.01)
*H01L 23/485* (2006.01)
(Continued)

(52) U.S. Cl.
CPC ........ *H01L 27/0886* (2013.01); *H01L 23/485* (2013.01); *H01L 23/528* (2013.01); *H01L 23/53295* (2013.01); *H01L 29/0649* (2013.01)

(58) Field of Classification Search
CPC ............ H01L 29/7856; H01L 29/7848; H01L 29/66795; H01L 29/41791; H01L 29/0649;
(Continued)

(56) References Cited

U.S. PATENT DOCUMENTS 7,501,674 B2 * 3/2009 Lee .................. H01L 21/82343
                                                          257/288
7,701,018 B2    4/2010 Yamagami et al.
(Continued)

FOREIGN PATENT DOCUMENTS

JP      2010-212450 A    9/2010
WO   WO 2010/103714 A1  9/2010

*Primary Examiner* — Yosef Gerbreyesus
(74) *Attorney, Agent, or Firm* — Lee & Morse, P.C.

(57) ABSTRACT

A semiconductor device, including first and second fin patterns separated by a first trench; a gate electrode intersecting the first and second fin patterns; and a contact on at least one side of the gate electrode, the contact contacting the first fin pattern, the contact having a bottom surface that does not contact the second fin pattern, a height from a bottom of the first trench to a topmost end of the first fin pattern in a region in which the contact intersects the first fin pattern being a first height, and a height from the bottom of the first trench to a topmost end of the second fin pattern in a region in which an extension line of the contact extending along a direction in which the gate electrode extends intersects the second fin pattern being a second height, the first height being smaller than the second height.

19 Claims, 22 Drawing Sheets

(51) Int. Cl.
  *H01L 23/528* (2006.01)
  *H01L 23/532* (2006.01)
  *H01L 29/06* (2006.01)

(58) Field of Classification Search
  CPC ............. H01L 29/785; H01L 27/0886; H01L 27/0924; H01L 27/1104; H01L 27/1203; H01L 21/823821; H01L 21/823431; H01L 21/845
  See application file for complete search history.

(56) References Cited

U.S. PATENT DOCUMENTS

| | | |
|---|---|---|
| 8,101,994 B2 | 1/2012 | Yu et al. |
| 8,377,779 B1 | 2/2013 | Wang |
| 8,697,515 B2 | 4/2014 | Yin et al. |
| 8,742,508 B2 | 6/2014 | Cheng et al. |
| 8,766,319 B2 | 7/2014 | Lai et al. |
| 2013/0026571 A1* | 1/2013 | Kawa ................ H01L 27/0207 257/347 |
| 2013/0082333 A1 | 4/2013 | Chen et al. |
| 2014/0203370 A1 | 7/2014 | Maeda et al. |
| 2014/0239395 A1 | 8/2014 | Basker et al. |
| 2014/0239396 A1 | 8/2014 | Liu et al. |
| 2014/0252496 A1 | 9/2014 | Liu et al. |
| 2014/0264342 A1 | 9/2014 | Romanescu |
| 2014/0264494 A1 | 9/2014 | Xu |
| 2014/0273397 A1 | 9/2014 | Rodder et al. |
| 2014/0291770 A1 | 10/2014 | Yin et al. |
| 2014/0322872 A1 | 10/2014 | Wang et al. |
| 2015/0008501 A1* | 1/2015 | Sakuma ............ H01L 21/28273 257/316 |

* cited by examiner

1200

1300

1400

SEMICONDUCTOR DEVICE

CROSS-REFERENCE TO RELATED APPLICATIONS

This is a continuation application based on pending application Ser. No. 14/995,457, filed Jan. 14, 2016, the entire contents of which is hereby incorporated by reference.

Korean Patent Application No. 10-2015-0046761, filed on Apr. 2, 2015, in the Korean Intellectual Property Office, and entitled: "Semiconductor Device," is incorporated by reference herein in its entirety.

BACKGROUND

1. Field

Embodiments relate to a semiconductor device.

2. Description of the Related Art

As one of the scaling techniques for increasing the density of a semiconductor device, a multi-gate transistor has been suggested. The multi-gate transistor may be obtained by forming a fin-shaped silicon body on a substrate and forming a gate on the surface of the silicon body.

SUMMARY

Embodiments may be realized by providing a semiconductor device, including a first fin pattern and a second fin pattern separated by a first trench, the first fin pattern and the second fin pattern extending along a first direction; a gate electrode extending along a second direction, the gate electrode intersecting the first fin pattern and the second fin pattern; and a contact on at least one side of the gate electrode, the contact contacting the first fin pattern, the contact having a bottom surface that does not contact the second fin pattern, a height from a bottom of the first trench to a topmost end of the first fin pattern in a region in which the contact intersects the first fin pattern being a first height, and a height from the bottom of the first trench to a topmost end of the second fin pattern in a region in which an extension line of the contact extending along the second direction intersects the second fin pattern being a second height, the first height being smaller than the second height.

The semiconductor may further include a field insulating layer filling part of the first trench. The bottom surface of the contact may contact the field insulating layer.

In the region in which the contact intersects the first fin pattern, an entirety of sidewalls of the first fin pattern may contact the field insulating layer.

In the region in which the extension line of the contact extending along the second direction intersects the second fin pattern, part of the second fin pattern may protrude further upward than a top surface of the field insulating layer.

The first trench may be on two sides of the second fin pattern, and the semiconductor device may further include a second trench, the second trench may be deeper than the first trench, and the second trench may be immediately adjacent to the first trench, on a side of the second fin pattern.

The semiconductor device may further include a second trench immediately adjacent to the first trench, and the second trench may be deeper than the first trench; and a protrusion structure at a boundary between the first trench and the second trench, the protrusion structure protruding from the bottom of the first trench.

A height of the protrusion structure may be smaller than the first height.

The contact may not contact the second fin pattern.

The semiconductor device may further include a field insulating layer filling part of the first trench; and an insulating layer pattern on the field insulating layer, the insulating layer pattern contacting the field insulating layer, and the insulating layer pattern may be between the contact and the second fin pattern. A height from the bottom of the first trench to the insulating layer pattern may be smaller than the second height.

The semiconductor device may further include a spacer on a sidewall of the gate electrode, the spacer extending along the second direction. Part of the first fin pattern may be between the spacer and the contact.

A top surface of the first fin pattern between the spacer and the contact may be more recessed than a top surface of the first fin pattern overlapped by the gate electrode.

The top surface of the first fin pattern between the spacer and the contact may lie in a same plane with the top surface of the first fin pattern overlapped by the gate electrode.

The semiconductor device may further include a spacer on a sidewall of the gate electrode, the spacer extending along the second direction; and an insulating layer pattern between the first fin pattern overlapped by the spacer and the contact.

Embodiments may be realized by providing a semiconductor device, including an active region defined by a first trench; a first fin pattern in the active region, the first fin pattern being defined by a second trench shallower than the first trench, the first fin pattern extending along a first direction; a second fin pattern on an outermost side of the active region, the second fin pattern being defined by the second trench, the second fin pattern extending along the first direction, the second fin pattern being between the first trench and the first fin pattern; a gate electrode extending along a second direction, the gate electrode intersecting the first fin pattern and the second fin pattern; and a contact on at least one side of the gate electrode, the contact contacting the first fin pattern, the contact having a bottom surface that does not contact the second fin pattern, a height from a bottom of the first trench to a topmost end of the first fin pattern in a region in which the contact intersects the first fin pattern being a first height, and a height from the bottom of the first trench to a topmost end of the second fin pattern in a region in which an extension line of the contact extending along the second direction intersects the second fin pattern being a second height, and the first height being smaller than the second height.

The semiconductor device may further include a field insulating layer filling part of the first trench and part of the second trench. The bottom surface of the contact may be along a top surface of the field insulating layer.

The semiconductor device may further include a protrusion structure at a boundary of the active region, the protrusion structure protruding from the bottom of the second trench.

The second fin pattern and the contact may not contact each other.

The semiconductor device may further include an interlayer insulating film between the second fin pattern and the contact.

Embodiments may be realized by providing a semiconductor device, including a fin pattern group including first and second fin patterns on outermost sides of the fin pattern group and an inner fin pattern between the first and second fin patterns; a gate electrode on the fin pattern group, the gate electrode extending along a second direction, the gate electrode intersecting an entirety of the fin pattern group; and a contact on at least one side of the gate electrode, the contact extending side by side with the gate electrode, the contact contacting the inner fin pattern, each of the first and second fin patterns and the inner fin pattern being defined by a first trench, each of the first and second fin patterns and the inner fin pattern extending along a first direction, a height from a bottom of the first trench to a topmost end of the inner fin pattern in a region in which the contact intersects the inner fin pattern being a first height, and a height from the bottom of the first trench to a topmost end of the first fin pattern in a region in which an extension line of the contact extending along the second direction intersects the first fin pattern being a second height, the first height being smaller than the second height.

The semiconductor device may further include a field insulating layer filling part of the first trench. A bottom surface of the contact may contact the field insulating layer.

The contact may penetrate the inner fin pattern, and the inner fin pattern may protrude further upward than a top surface of the field insulating layer.

Each of the first fin pattern and the second fin pattern may not contact the contact.

The semiconductor device may further include a second trench adjacent to the first fin pattern and the second fin pattern, and the second trench may be deeper than the first trench. The fin pattern group may be in an active region defined by the second trench.

The first trench and the second trench may be located on a side of the first fin pattern, the first trench and the second trench may be immediately adjacent to each other, and the semiconductor device may further include a protrusion structure at a boundary between the first trench and the second trench, the protrusion structure protruding from the bottom of the first trench.

The semiconductor device may further include a field insulating layer filling part of the first trench and part of the second trench. The protrusion structure may be lower than the top surface of the field insulating layer.

A height from the bottom of the first trench to a topmost end of the second fin pattern in a region in which the extension line of the contact extending along the second direction intersects the second fin pattern may be a third height, and the first height may be smaller than the third height.

Embodiments may be realized by providing a semiconductor device, including a first fin pattern defined by a trench, the first fin pattern extending along a first direction, the first fin pattern including a first part and a second part, the second part being on two sides of the first part in the first direction, the second part having a recess; a second fin pattern defined by the trench, the second fin pattern extending side by side with the first fin pattern, the second fin pattern including a third part corresponding to the first part and a fourth part corresponding to the second part, the fourth part being on two sides of the third part in the first direction; a gate electrode extending along a second direction different from the first direction, the gate electrode being on the first part and the third part; and a contact filling the recess, the contact contacting the first fin pattern, a bottom surface of the contact not contacting the fourth part.

The semiconductor device may further include a field insulating layer filling part of the trench. The contact may penetrate the second part, and the second part may protrude further upward than a top surface of the field insulating layer.

Embodiments may be realized by providing a semiconductor device, including a first fin pattern and a second fin pattern separated by a trench, the first fin pattern and a second fin pattern extending along a first direction; a gate electrode extending along a second direction, the gate electrode intersecting the first fin pattern and the second fin pattern; and a contact on at least one side of the gate electrode, the contact contacting the first fin pattern and the second fin pattern, a height from a bottom of the trench to a topmost end of the first fin pattern in a region in which the contact intersects the first fin pattern being a first height, and a height from the bottom of the trench to a topmost end of the second fin pattern in a region in which the contact intersects the second fin pattern being a second height, the first height being smaller than the second height.

Part of a sidewall of the contact may be defined by the second fin pattern.

Embodiments may be realized by providing a semiconductor device, including fin patterns extending along a first direction; a gate electrode extending along a second direction different from the first direction, the gate electrode intersecting each of the fin patterns; and a contact on at least one side of the gate electrode, the contact intersecting a smaller number of fin patterns than a number of fin patterns intersected by the gate electrode.

A first portion of the fin patterns intersected by the contact may have a first height, and a second portion of the fin patterns intersected by the gate electrode may have a second height, and the first height may be smaller than the second height.

The contact may intersect one less fin pattern than does the gate electrode.

The contact may intersect two less fin patterns than does the gate electrode.

The contact may partially intersect at least one fin pattern.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
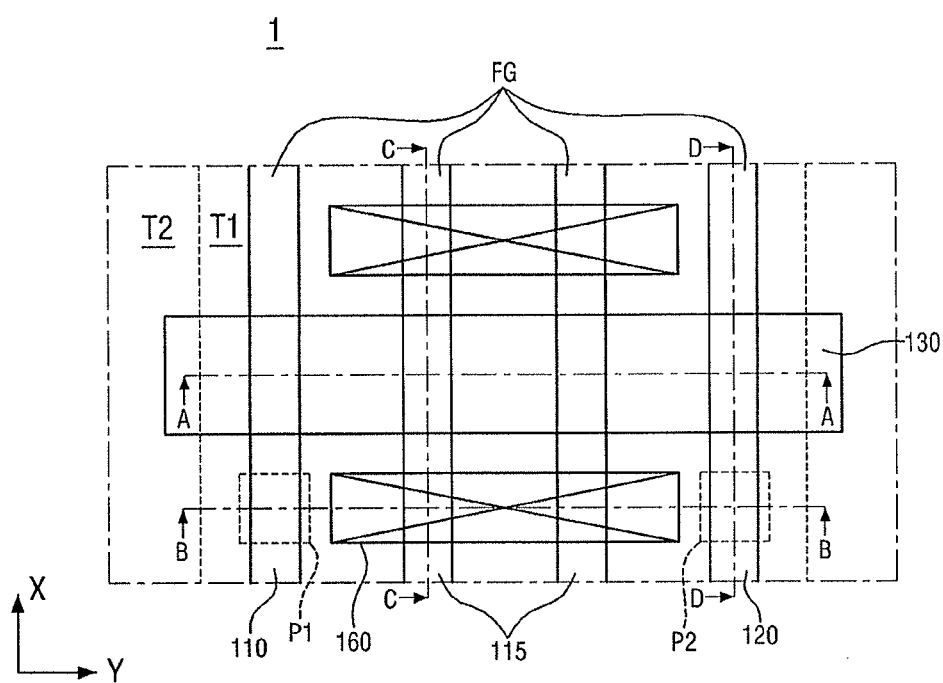
FIG. 1 illustrates a layout view of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

It will be understood that, although the terms first, second, etc., may be used herein to describe various elements, these elements should not be limited by these terms. These terms are only used to distinguish one element from another element. Thus, for example, a first element, a first component or a first section discussed below could be termed a second element, a second component or a second section.

The use of the terms "a" and "an" and "the" and similar referents (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of skill in the art. It is noted that the use of any and all examples, or exemplary terms provided herein is intended merely to better illuminate and is not a limitation on scope unless otherwise specified. Further, unless defined otherwise, all terms defined in generally used dictionaries may not be overly interpreted.

A semiconductor device according to an embodiment concept will now be described with reference to FIGS. 1 through 5A.

Figure 2:
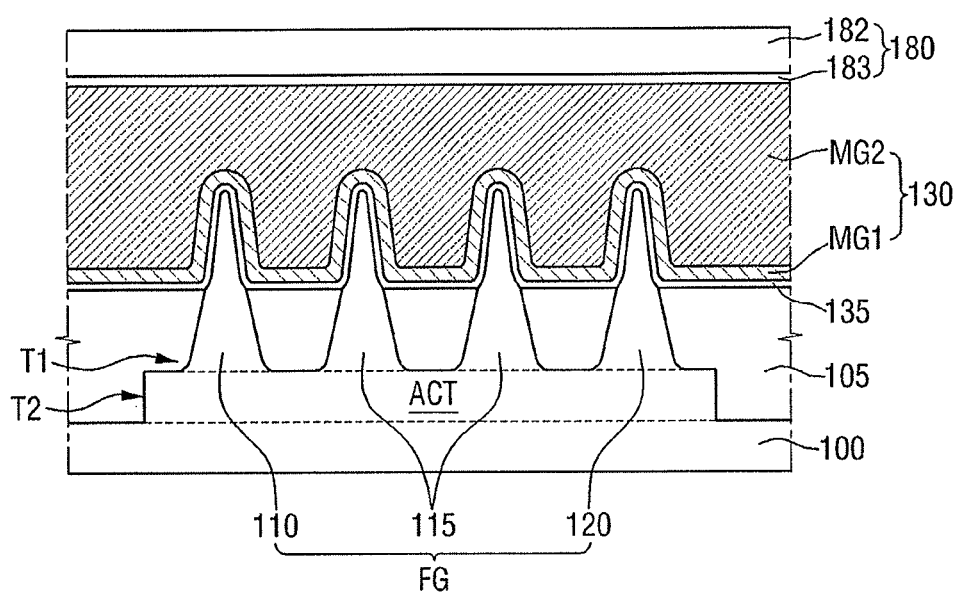
FIG. 2 illustrates a cross-sectional view taken along the line A-A of FIG. 1.
Figure 3:
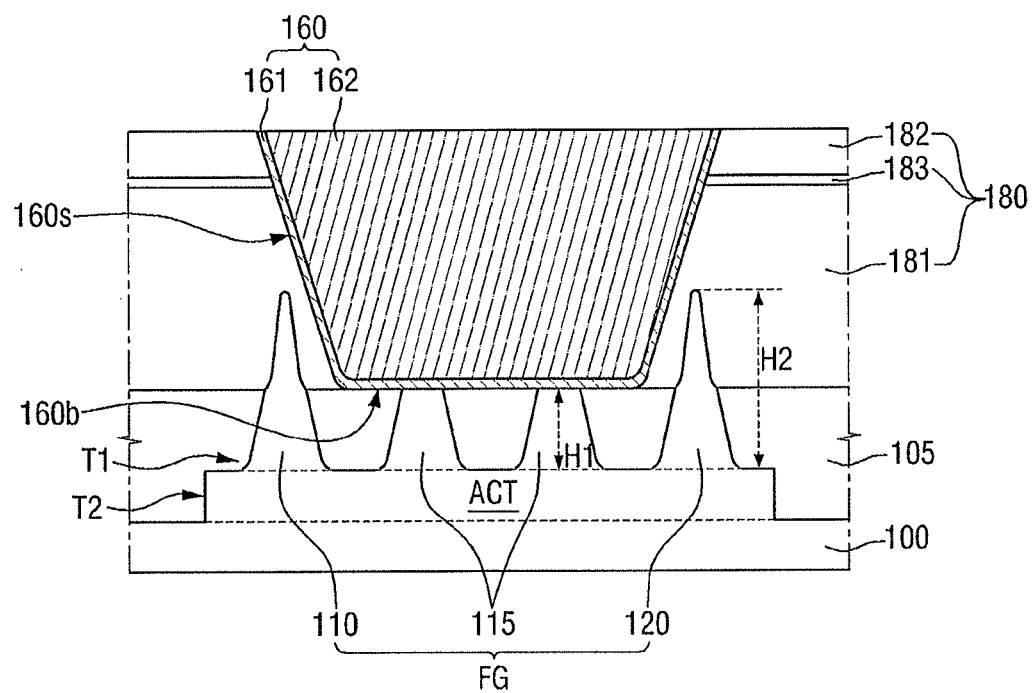
FIG. 3 illustrates a cross-sectional view taken along the line B-B of FIG. 1.
Figure 4:
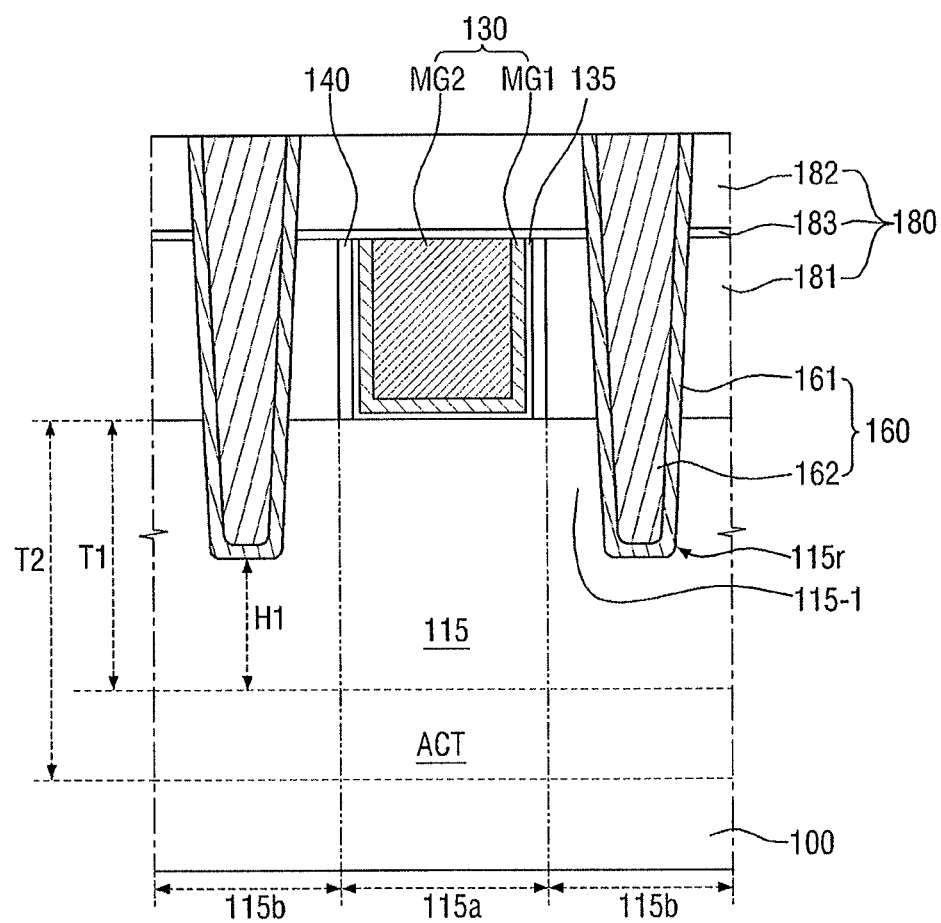
FIG. 4 illustrates a cross-sectional view taken along the line C-C of FIG. 1.
Figure 5A:
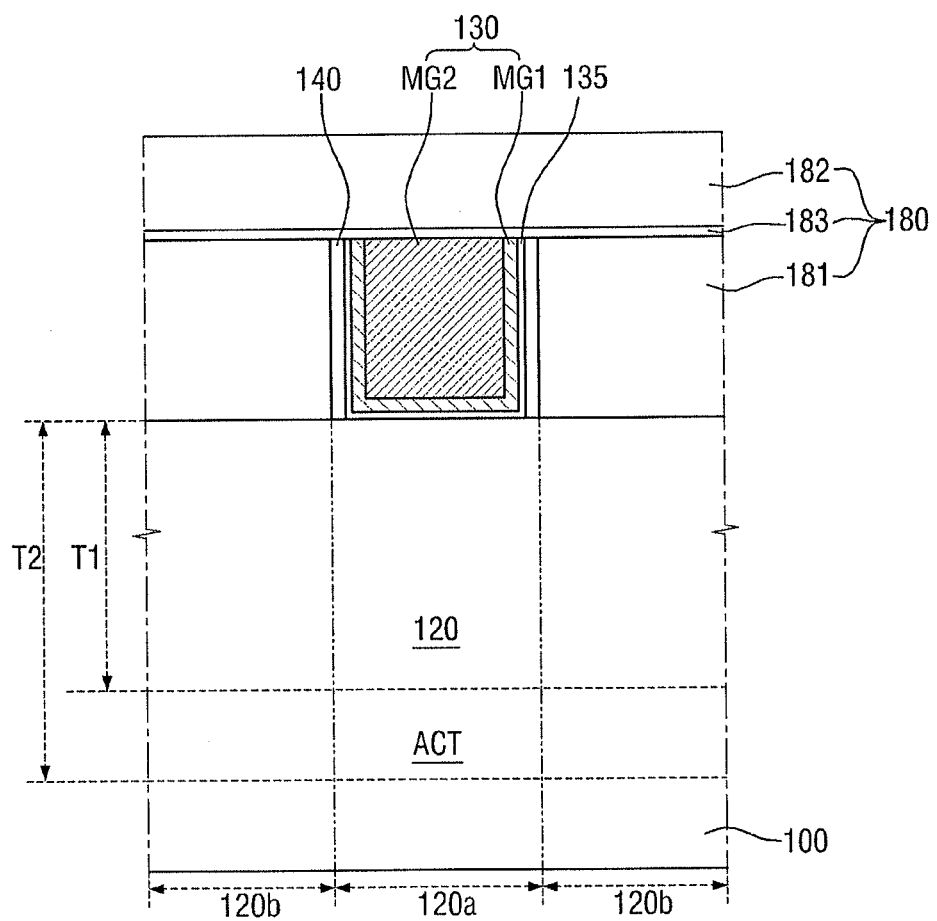
FIG. 5A illustrates a cross-sectional view taken along the line D-D of FIG. 1.

FIG. 1 illustrates a layout view of a semiconductor device 1 according to an embodiment. FIG. 2 illustrates a cross-sectional view taken along the line A-A of FIG. 1. FIG. 3 illustrates a cross-sectional view taken along the line B-B of FIG. 1. FIG. 4 illustrates a cross-sectional view taken along the line C-C of FIG. 1. FIG. 5A illustrates a cross-sectional view taken along the line D-D of FIG. 1.

Referring to FIGS. 1 through 5A, the semiconductor device 1 according to an embodiment may include a fin pattern group FG, a gate electrode 130, and a contact 160.

The substrate 100 may be a bulk silicon substrate or a silicon-on-insulator (SOI) substrate. In an embodiment, the substrate 100 may be a silicon substrate or a substrate made of another material such as silicon germanium, indium antimonide, lead telluride, indium arsenide, indium phosphide, gallium arsenide or gallium antimonide. In an embodiment, the substrate 100 may include a base substrate and an epitaxial layer formed on the base substrate.

The fin pattern group FG may be formed in an active region ACT of the substrate 100. The fin pattern group FG may protrude from the substrate 100, for example, from the active region ACT.

A "fin pattern group" may denote fin patterns intersecting one gate electrode. For example, the fin pattern group FG may be a set of fin patterns intersecting the gate electrode 130.

The fin pattern group FG may include a plurality of fin patterns extending along a first direction X. Each of the fin patterns included in the fin pattern group FG may extend along the first direction X. The fin patterns included in the fin pattern group FG may be arranged along a second direction Y.

The fin pattern group FG may include a first fin pattern 110 and a second fin pattern 120. The fin pattern group FG may include inner fin patterns 115 formed between the first fin pattern 110 and the second fin pattern 120.

Each of the first fin pattern 110 and the second fin pattern 120 may be located on an outermost side of the fin pattern group FG. For example, in the second direction Y, the fin pattern group FG may not be located on a side of the first fin pattern 110, and the inner fin patterns 115 included in the fin pattern group FG may be located on the other side of the first fin pattern 110.

In the semiconductor device 1 according to the embodiment illustrated in FIG. 1, each of the first fin pattern 110 and the second fin pattern 120 may be formed on an outermost side of the active region ACT.

In FIG. 1, the fin pattern group FG includes, for example, four fin patterns. In an embodiment, one inner fin pattern 115 or three or more inner fin patterns 115 may be placed between the first fin pattern 110 and the second fin pattern 120.

The fin pattern group FG may be part of the substrate 100 and may include an epitaxial layer grown from the substrate 100. Fin patterns included in the fin pattern group FG may contain the same material.

The fin pattern group FG may include an element semiconductor material such as silicon or germanium. The fin pattern group FG may include a compound semiconductor such as a group IV-IV compound semiconductor or a group III-V compound semiconductor.

For example, the group IV-IV compound semiconductor that forms the fin pattern group FG may be a binary or ternary compound containing two or more of carbon (C), silicon (Si), germanium (Ge) and tin (Sn) or a compound obtained by doping the binary or ternary compound with a group IV element.

The group III-V compound semiconductor that forms the fin pattern group FG may be a binary, ternary, or quaternary compound composed of one or more of aluminum (Al), gallium (Ga), or indium (In) (i.e., group III elements) bonded with one of phosphorus (P), arsenic (As), or antimony (Sb) (i.e., group V elements).

In FIGS. 4 and 5A, the second fin pattern 120 may include a first part 120a and a second part 120b. The second part 120b of the second fin pattern 120 may be disposed on both sides of the first part 120a of the second fin pattern 120 in the first direction X. Like the second fin pattern 120, the first fin pattern 110 may include a first part and a second part.

Each of the inner fin patterns 115 may include a first part 115a and a second part 115b. The second part 115b of each of the inner fin patterns 115 may be disposed on both sides of the first part 115a in the first direction X. For example, the first part 115a of each of the inner fin patterns 115 may correspond to the first part 120a of the second fin pattern 120, and the second part 115b of each of the inner fin patterns 115 may correspond to the second part 120b of the second fin pattern 120.

Each of the fin patterns 110, 115 and 120 included in the fin pattern group FG may be defined by a first trench T1 having a first depth, and the active region ACT may be defined by a second trench T2 having a second depth which is greater than the first depth. The first trench T1 may be a shallow trench, and the second trench T2 may be a deep trench.

The first trench T1 may be formed on both sides of each fin pattern included in the fin pattern group FG. For example, the first trench T1 may be formed on both sides of the first fin pattern 110 and both sides of the second fin pattern 120.

The first trench T1 may separate the first fin pattern 110 and the inner fin pattern 115 and separate the second fin pattern 120 and the inner fin pattern 115. For example, the first fin pattern 110 and the inner fin pattern 115 closest to the first fin pattern 110 may be separated by the first trench T1.

The second trench T2 may be formed on both sides of the fin pattern group FG. The second trench T2 may be formed on a side of each of the first fin pattern 110 and the second fin pattern 120 which are the outermost fin patterns among the fin patterns included in the fin pattern group FG.

In the semiconductor device 1 according to the embodiment illustrated in FIG. 1, each of the first fin pattern 110 and the second fin pattern 120 may be formed between the inner fin pattern 115 and the second trench T2 which defines the active region ACT.

The first trench T1 and the second trench T2 which are formed on a side of each of the first fin pattern 110 and the second fin pattern 120 may be disposed immediately adjacent to each other. The term "immediately adjacent" denotes that another trench (i.e., a shallow trench) having the first depth is not formed between the first trench T1 and the second trench T2.

A field insulating layer 105 may be formed on the substrate 100. The field insulating layer 105 may be formed to fill part of the first trench T1 and part of the second trench T2. The field insulating layer 105 may include one of an oxide layer, a nitride layer, an oxynitride layer, and combinations of the same.

The field insulating layer 105 may partially contact each of the fin patterns 110, 115 and 120 included in the fin pattern group FG. At least part of each of the fin patterns 110, 115 and 120 included in the fin pattern group FG may protrude further upward than a top surface of the field insulating layer 105.

The gate electrode 130 may be formed on the fin pattern group FG to extend along the second direction Y. The gate electrode 130 may intersect the entire fin pattern group FG. The gate electrode 130 may intersect the first fin pattern 110, the second fin pattern 120, and the inner fin patterns 115.

The gate electrode 130 may be formed on the field insulating layer 105. For example, the gate electrode 130 may be formed on the first part 120a of the second fin pattern 120 and the first part 115a of each of the inner fin patterns 115.

The gate electrode 130 may include metal layers (MG1, MG2). As illustrated in the drawings, the gate electrode 130 may be formed by stacking two or more metal layers (MG1, MG2). A first metal layer MG1 may control a work function, and a second metal layer MG2 may fill a space formed by the first metal layer MG1. For example, the first metal layer MG1 may include one or more of, for example, TiN, WN, TiAl, TiAlN, TiAlC, TaN, TiC, TaC, TaCN, or TaSiN. The second metal layer MG2 may include one or more of, for example, W, Al, Cu, Co, Ti, Ta, poly-Si, SiGe, or metal alloys.

The gate electrode 130 may be formed by, for example, a replacement process (or a gate last process).

A gate insulating layer 135 may be formed between the fin pattern group FG and the gate electrode 130. The gate insulating layer 135 may be formed between the first fin pattern 110 and the gate electrode 130, between the second fin pattern 120 and the gate electrode 130, and between the inner fin patterns 115 and the gate electrode 130.

The gate insulating layer 135 may be formed along the profile of the fin pattern group FG which protrudes further upward than the field insulating layer 105, for example, along the profile of the first fin pattern 110 and the profile of the second fin pattern 120. The gate insulating layer 135 may be formed between the gate electrode 130 and the field insulating layer 105.

The gate insulating layer 135 may include silicon oxide, silicon oxynitride, silicon nitride, or a high-k material having a higher dielectric constant than silicon oxide. For example, the high-k material may include one or more of, for example, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

Spacers 140 may be formed on sidewalls of the gate electrode 130 extending along the second direction Y. The spacers 140 may include one or more of silicon nitride (SiN), silicon oxynitride (SiON), silicon oxide ($SiO_2$), or silicon oxycarbonitride (SiOCN).

An impurity region may be formed on both sides of the gate electrode 130. The impurity region may be formed in each of the fin patterns 110, 115 and 120 included in the fin pattern group FG.

An interlayer insulating film 180 may cover the fin pattern group FG. The interlayer insulating film 180 may also cover the gate electrode 130. The interlayer insulating film 180 may be formed on the substrate 100, for example, on the field insulating layer 105.

A lower interlayer insulating film 181 may cover the sidewalls of the gate electrode 130. An interlayer liner film 183 and an upper interlayer insulating film 182 may be formed on the gate electrode 130. For example, the interlayer liner film 183 may be formed along a top surface of the gate electrode 130.

The interlayer insulating film 180 may include the lower interlayer insulating film 181, the interlayer liner film 183, and the upper interlayer insulating film 182 formed sequentially on the field insulating film 105. The lower interlayer insulating film 181 and the upper interlayer insulating film 182 may be separated by, e.g., the interlayer liner film 183.

Each of the lower interlayer insulating film 181 and the upper interlayer insulating film 182 may include one or more of silicon oxide, silicon nitride, silicon oxynitride, or a low-k material having a lower dielectric constant than silicon oxide. The low-k material may be, for example, Flowable Oxide (FOX), Tonen SilaZen (TOSZ), Undoped Silica Glass (USG), Borosilica Glass (BSG), PhosphoSilica Glass (PSG), BoroPhosphoSilica Glass (BPSG), Plasma Enhanced Tetra Ethyl Ortho Silicate (PETEOS), Fluoride Silicate Glass (FSG), Carbon Doped silicon Oxide (CDO), Xerogel, Aerogel, Amorphous Fluorinated Carbon, Organo Silicate Glass (OSG), Parylene, bis-benzocyclobutenes (BCB), SiLK, polyimide, porous polymeric material, or any combination of the same.

The interlayer liner film 183 may include a different material from the lower interlayer insulating film 181 and the upper interlayer insulating film 182. The interlayer liner film 183 may include, for example, silicon nitride (SiN).

The contact 160 may be formed in the interlayer insulating film 180. The contact 160 may penetrate through the upper interlayer insulating film 182, the interlayer liner film 183 and the lower interlayer insulating film 181. The contact 160 may be formed on at least one side of the gate electrode 130. For example, the contact 160 may be formed on both sides of the gate electrode 130.

The contact 160 may be formed on the fin pattern group FG on a side of the gate electrode 130, and the contact 160 may extend along the second direction Y.

The contact 160 may intersect the inner fin patterns 115. In FIGS. 1 and 3, the contact 160 intersects, for example, all of the inner fin patterns 115.

The contact 160 may include a barrier layer 161 and a filling layer 162. The barrier layer 161 may be formed along a contact hole formed in the interlayer insulating film 180.

The filling layer 162 may fill the contact hole in which the barrier layer 161 is formed. The filling layer 162 may be formed on the barrier layer 161.

The barrier layer 161 may include tantalum (Ta), tantalum nitride (TaN), titanium (Ti), titanium nitride (TiN), ruthenium (Ru), cobalt (Co), nickel (Ni), nickel boride (NiB), or tungsten nitride (WN).

The filling layer 162 may include, for example, aluminum (Al), tungsten (W), copper (Cu), cobalt (Co), or doped polysilicon.

In the semiconductor device 1 according to the embodiment illustrated in FIG. 1, the contact 160 may not intersect the first fin pattern 110 and the second fin pattern 120 which are located on the outermost sides of the active region ACT. The number of fin patterns of the fin pattern FG which are intersected by the gate electrode 130 may be different from, e.g., greater than, the number of fin patterns of the fin pattern group FG which are intersected by the contact 160.

The contact 160 may not contact the first fin pattern 110 and the second fin pattern 120. The contact 160 may not contact the first fin pattern 110 and the second fin pattern 120 which are formed on the outermost sides of the fin pattern group FG.

The contact 160 may contact the inner fin patterns 115. A semiconductor pattern may not be formed between the contact 160 and each of the inner fin patterns 115. The direct contact between the contact 160 and the inner fin patterns 115 may improve the operating stability of the semiconductor device 1 in a high-voltage operation.

A bottom surface 160b of the contact 160 may not contact the first fin pattern 110 and the second fin pattern 120. The bottom surface 160b of the contact 160 may contact the inner fin patterns 115.

The bottom surface 160b of the contact 160 may contact the field insulating layer 105 and the inner fin patterns 115. The bottom surface 160b of the contact 160 may be formed along the top surface of the field insulating layer 105 and top surfaces of the inner fin patterns 115. For example, the barrier layer 161 may be formed along the profile of the top surface of the field insulating layer 105 and the profiles of the top surfaces of the inner fin patterns 115.

Sidewalls 160s of the contact 160 may not contact the first fin pattern 110 and the second fin pattern 120. The sidewalls 160s of the contact 160 may not contact the first fin pattern 110 and the second fin pattern 120 which protrude further upward than the top surface of the field insulating layer 105. Part of the interlayer insulating film 180 may be interposed between the sidewall 160s of the contact 160 and the first fin pattern 110 and between the sidewall 160s of the contact 160 and the second fin pattern 120.

In FIG. 1, the inner fin patterns 115 intersect the contact 160, and each of the inner fin patterns 115 may include a region which intersects the contact 160. The first fin pattern 110 and the second fin pattern 120 do not intersect the contact 160, and each of the first fin pattern 110 and the second fin pattern 120 may not include a region which intersects the contact 160.

In an embodiment, the first fin pattern 110 may include a first region P1 which intersects an extension line of the contact 160 extending along the second direction Y. The second fin pattern 120 may include a second region P2 which intersects an extension line of the contact 160 extending along the second direction Y.

In a region in which the inner fin patterns 115 intersect the contact 160, a height from a bottom of the first trench T1 to a topmost end of each of the inner fin patterns 115 may be a first height h1. In the region P2 in which the second fin pattern 120 intersects the extension line of the contact 160 extending along the second direction Y, a height from the bottom of the first trench T1 to a topmost end of the second fin pattern 120 may be a second height h2.

In semiconductor devices according to embodiments, the first height h1 from the bottom of the first trench T1 to the topmost end of each of the inner fin patterns 115 may be smaller than the second height h2 from the bottom of the first trench T1 to the topmost end of the second fin pattern 120.

Similarly, the first height h1 from the bottom of the first trench T1 to the topmost end of each of the inner fin patterns 115 in the region in which the inner fin patterns 115 intersect the contact 160 may be smaller than a height from the bottom of the first trench T1 to a topmost end of the first fin pattern 110 in the region P1 in which the first fin pattern 110 intersects the extension line of the contact 160 extending along the second direction Y.

In the semiconductor device 1 according to the embodiment illustrated in FIG. 1, the contact 160 may contact the inner fin patterns 115 and the field insulating layer 105, and in the region in which the contact 160 intersects the inner fin patterns 115, the inner fin patterns 115 may not protrude further upward than the top surface of the field insulating layer 105. In the region in which the contact 160 intersects the inner fin patterns 115, the entire sidewalls of the inner fin patterns 115 may contact the field insulating layer 105.

Each of the first fin pattern 110 and the second fin pattern 120 may not contact the contact 160, and in the region P1 in which the extension line of the contact 160 extending along the second direction Y intersects the first fin pattern 110 and in the region P2 in which the extension line of the contact 160 extending along the second direction Y intersects the second fin pattern 120, part of the first fin pattern 110 and part of the second fin pattern 120 may protrude further upward than the top surface of the field insulating layer 105.

The contact 160 may contact the inner fin patterns 115 and may be formed on at least one of the gate electrode 130, and the contact 160 may fill a recess 115r formed in the second part 115b of each of the inner fin patterns 115. A part of the contact 160 which fills the recess 115r may contact each of the inner fin patterns 115.

In FIGS. 3 and 4, the contact 160 may contact the field insulating layer 105, and a height from the bottom of the first trench T1 to a bottom of the recess 115r may be the first height h1 from the bottom of the first trench T1 to the topmost end of each of the inner fin patterns 115. The recess 115r may be formed in the second part 115b of each of the inner fin patterns 115 which protrude further upward than the top surface of the field insulating layer 105, and the contact 160 may penetrate each of the inner fin patterns 115 which protrudes further upward than the top surface of the field insulating layer 105, for example, the second part 115b of each of the inner fin patterns 115.

In an embodiment, the contact 160 may not contact the first fin pattern 110 and the second fin pattern 120, and it may not contact the second part 120b of the second fin pattern 120. The contact 160 may not penetrate the second part 120b of the second fin pattern 120 which protrudes further upward than the top surface of the field insulating layer 105.

In FIGS. 1 and 4, a width of the contact 160 in the first direction X may be smaller than a width of the second part 115b of each of the inner fin patterns 115 in the first direction X, and a semiconductor region 115-1, which is part of the second part 115b of each of the inner fin patterns 115, may be interposed between the spacer 140 and the contact 160.

A top surface of the second part 115b of each inner fin pattern 115 which is located between the spacer 140 and the contact 160 may lie in the same plane with a top surface of the first part 115a of each inner fin pattern 115 which is overlapped by the gate electrode 130.

Figure 5B:
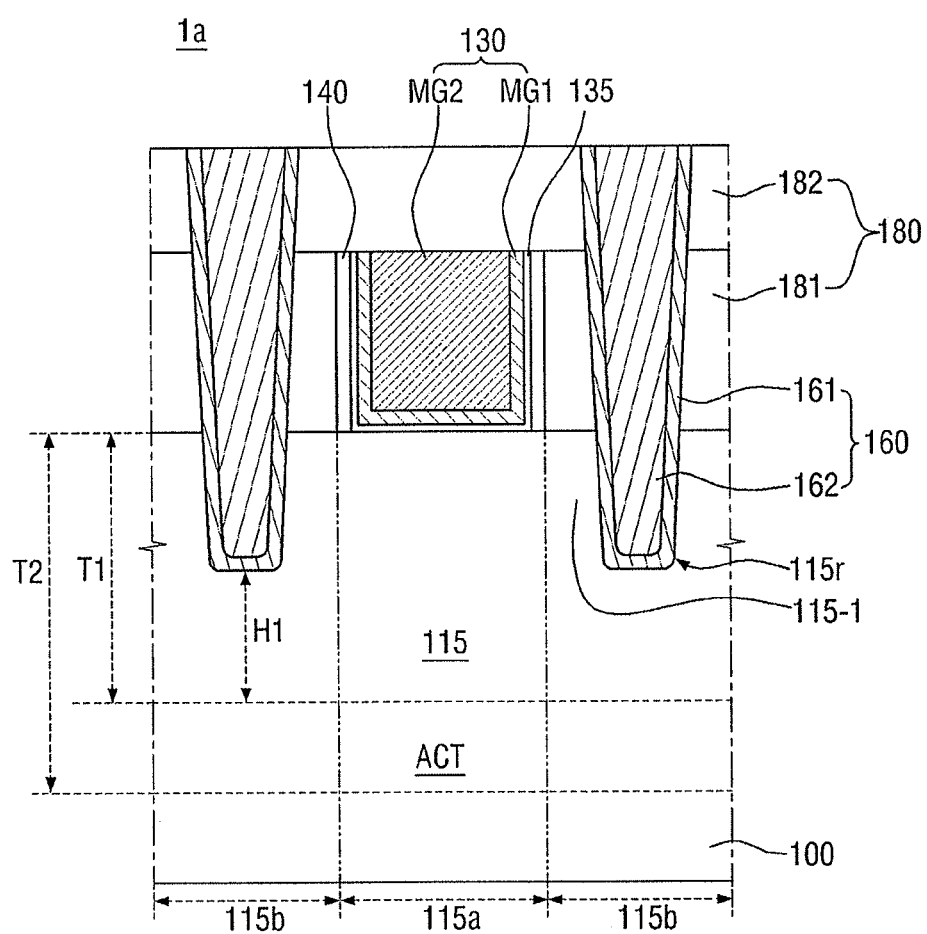
FIG. 5B illustrates a view of a modified example of the semiconductor device according to the embodiment illustrated in FIG. 1.

FIG. 5B illustrates a view of a modified example 1a of the semiconductor device 1 according to the embodiment illustrated in FIG. 1. For reference, FIG. 5B illustrates a cross-sectional view taken along the line C-C of FIG. 1.

Referring to FIG. 5B, in the modified example 1a of the semiconductor device 1 according to the embodiment illustrated in FIG. 1, an interlayer insulating film 180 may not include an interlayer liner film 183.

For example, an upper interlayer insulating film 182 may be formed on a lower interlayer insulating film 181, and the lower interlayer insulating film 181 and the upper interlayer insulating film 182 may contact each other.

Each of the lower interlayer insulating film 181 and the upper interlayer insulating film 182 may be distinguished based on whether it was deposited before the formation of, e.g., a gate electrode 130.

Figure 6:
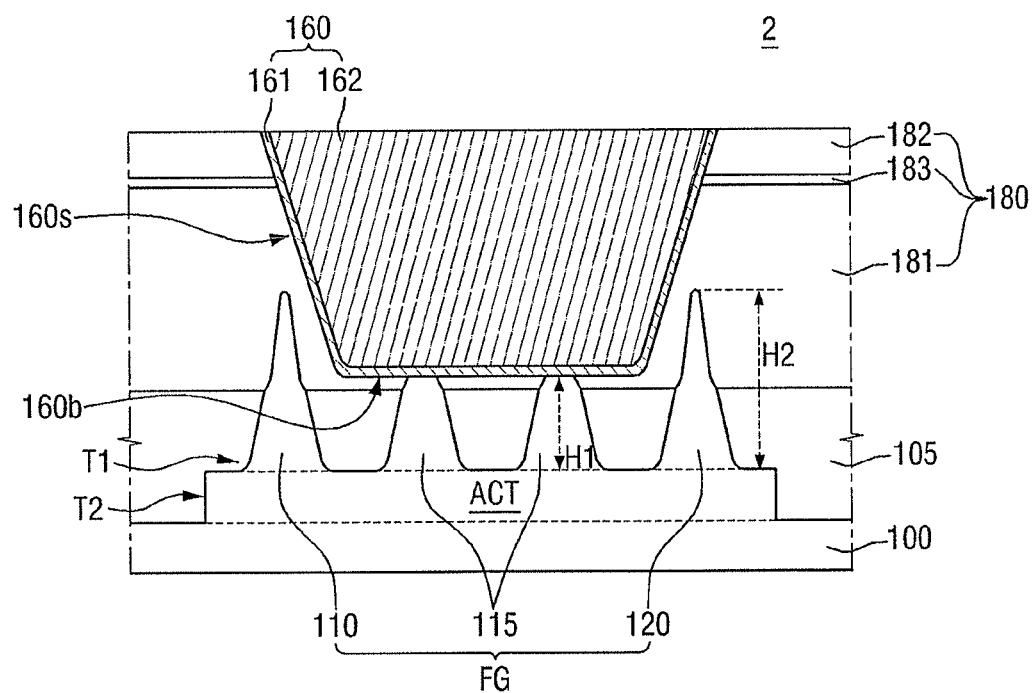
FIG. 6 illustrates a view of a semiconductor device according to an embodiment.

FIG. 6 illustrates a view of a semiconductor device 2 according to an embodiment. For simplicity, the following description will focus on differences with FIGS. 1 through 5A.

Referring to FIG. 6, in the semiconductor device 2 according to an embodiment, a contact 160 may contact inner fin patterns 115 and may not contact a field insulating layer 105.

Part of a lower interlayer insulating film 181 included in an interlayer insulating film 180 may be interposed between a bottom surface 160b of the contact 160 and a top surface of the field insulating layer 105.

In a region in which the contact 160 intersects the inner fin patterns 115, the inner fin patterns 115 may protrude further upward than the top surface of the field insulating layer 105. In the region in which the contact 160 intersects the inner fin patterns 115, part of sidewalls of the inner fin patterns 115 may contact the field insulating layer 105, and the other part of the sidewalls of the inner fin patterns 115 may contact the interlayer insulating film 180.

Figure 7:
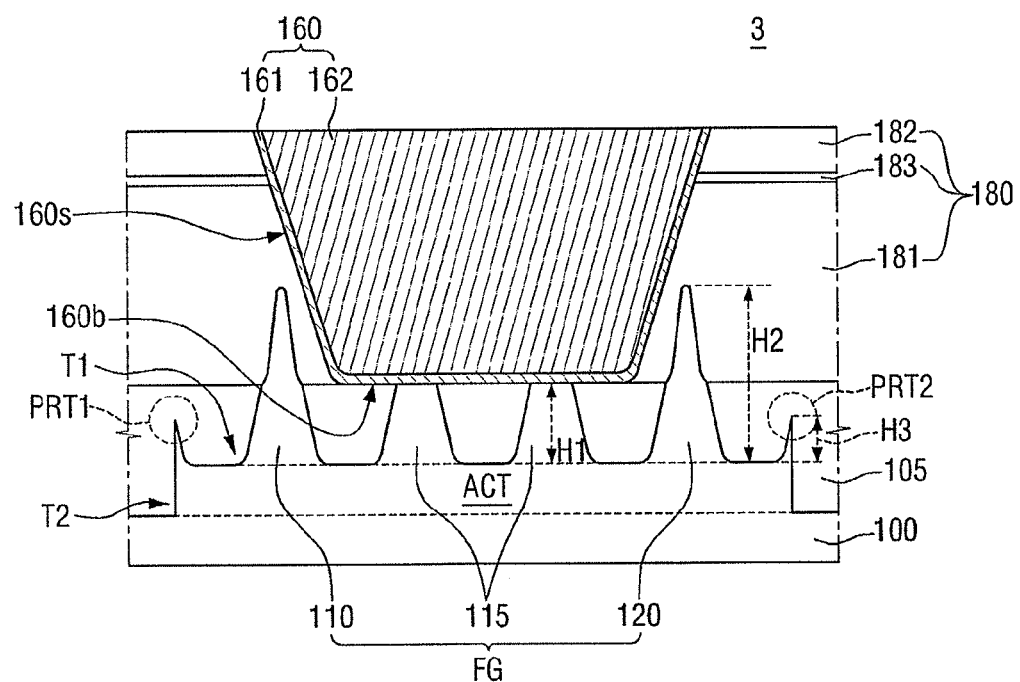
FIG. 7 illustrates a view of a semiconductor device according to an embodiment.

FIG. 7 illustrates a view of a semiconductor device 3 according to an embodiment. For simplicity, the following description will focus on differences with FIGS. 1 through 5A.

Referring to FIG. 7, the semiconductor device 3 according to an embodiment may further include a first protrusion structure PRT1 and a second protrusion structure PRT2.

The first protrusion structure PRT1 may be formed between a first fin pattern 110 and a second trench T2. The first protrusion structure PRT1 may be located at a boundary between a first trench T1 and the second trench T2 which are formed on a side of the first fin pattern 110.

The second protrusion structure PRT2 may be formed between a second fin pattern 120 and the second trench T2. The second protrusion structure PRT2 may be located at a boundary between the first trench T1 and the second trench T2 which are formed on a side of the second fin pattern 120.

The first protrusion structure PRT1 and the second protrusion structure PRT2 may be formed in a boundary region of an active region ACT.

Each of the first protrusion structure PRT1 and the second protrusion structure PRT2 may protrude from a bottom of the first trench T1. Each of the first protrusion structure PRT1 and the second protrusion structure PRT2 may be formed lower than a top surface of a field insulating layer 105.

For example, a height h3 of the second protrusion structure PRT2 may be defined as a height from the bottom of the first trench T1 to a topmost end of the second protrusion structure PRT2. The height h3 of the second protrusion structure PRT2 may be smaller than a height h1 from the bottom of the first trench T1 to a topmost end of each inner fin pattern 115 in a region in which the inner fin patterns 115 intersect a contact 160. Further, a height h2 from the bottom of the first trench T1 to a topmost end of the second fin pattern 120 in a region P2 in which the second fin pattern 120 intersects an extension line of the contact 160 extending along a second direction Y may be greater than the height h3 of the second protrusion structure PRT2.

The first protrusion structure PRT1 and the second protrusion structure PRT2 formed on both sides of a fin pattern group FG may be different or equal.

The first protrusion structure PRT1 and the second protrusion structure PRT2 may extend along a direction (a first direction X) in which the fin patterns 110, 115 or 120 included in the fin pattern group FG extends. A gate electrode 130 may traverse the fin pattern group FG, the first protrusion structure PRT1, and the second protrusion structure PRT2.

Figure 8:
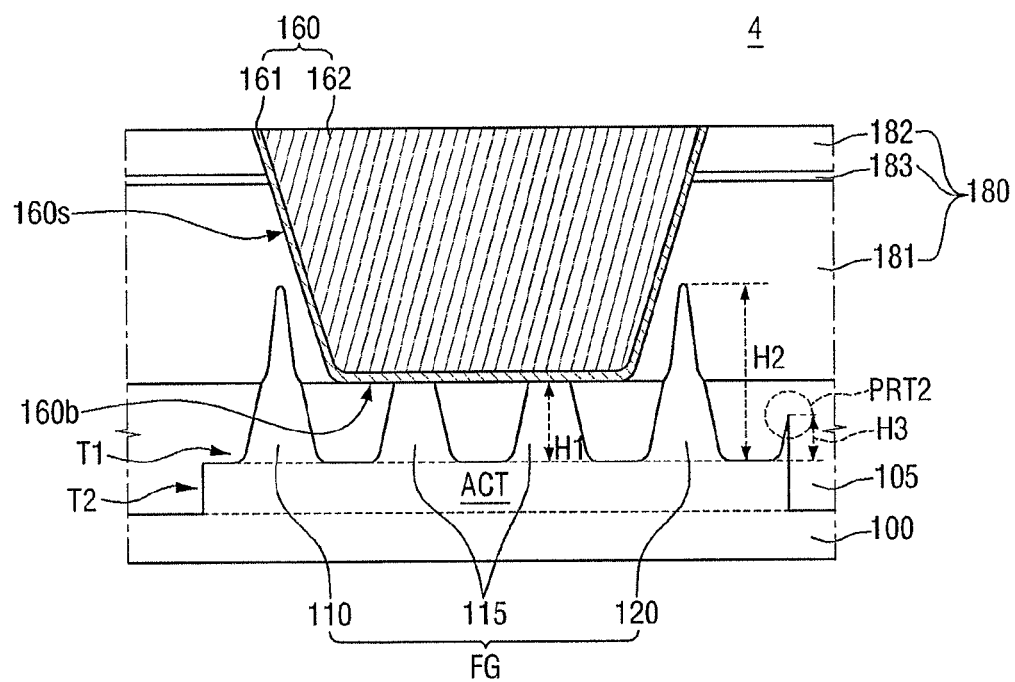
FIG. 8 illustrates a view of a semiconductor device according to an embodiment.

FIG. 8 illustrates a view of a semiconductor device 4 according to an embodiment. For simplicity, the following description will focus on differences with FIG. 7.

Referring to FIG. 8, in the semiconductor device 4 according to an embodiment, no protrusion structure may be disposed on a side of an active region ACT, and a second protrusion structure PRT2 may be disposed on the other side of the active region ACT.

Even if the second protrusion structure PRT2 is disposed only on the other side of the active region ACT, a height h3 of the second protrusion structure PRT2 may be lower than a top surface of a field insulating layer 105.

Figure 9:
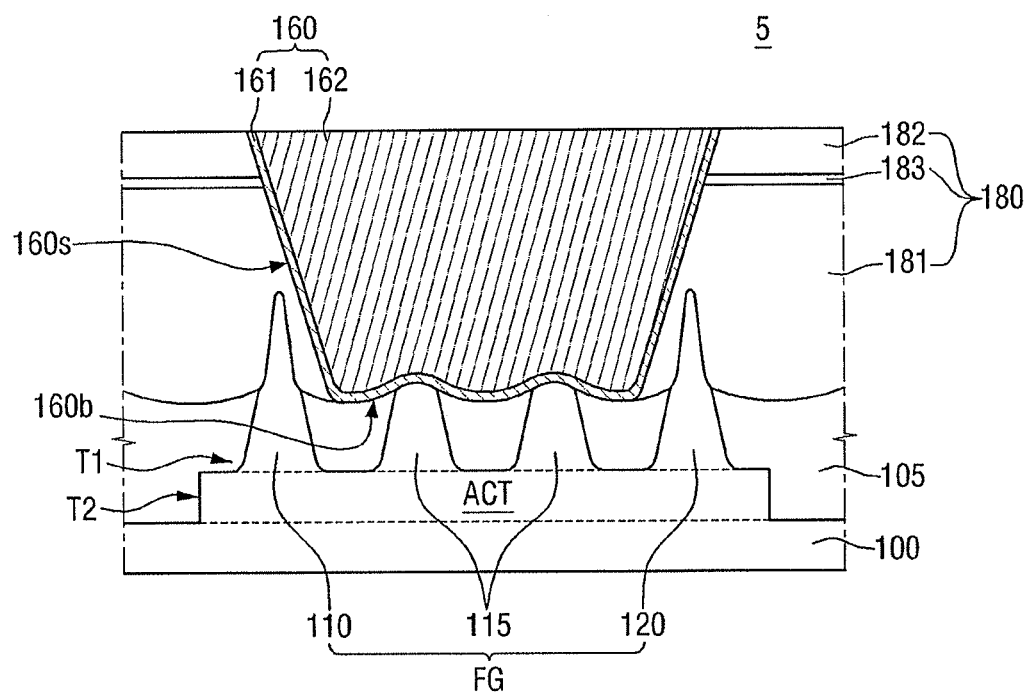
FIG. 9 illustrates a view of a semiconductor device according to an embodiment.

FIG. 9 illustrates a view of a semiconductor device 5 according to an embodiment. For simplicity, the following description will focus on differences with FIGS. 1 through 5A.

Referring to FIG. 9, in the semiconductor device 5 according to an embodiment, a bottom surface 160b of a contact 160 may be wavy.

For example, a top surface of each inner fin pattern 115 may be upwardly convex, and a top surface of a field insulating layer 105 may be downwardly convex.

The bottom surface 160b of the contact 160 on the top surface of each inner fin pattern 115 may form a crest of a wave, and the bottom surface 160b of the contact 160 on the top surface of the field insulating layer 105 may form a valley of the wave.

Figure 10:
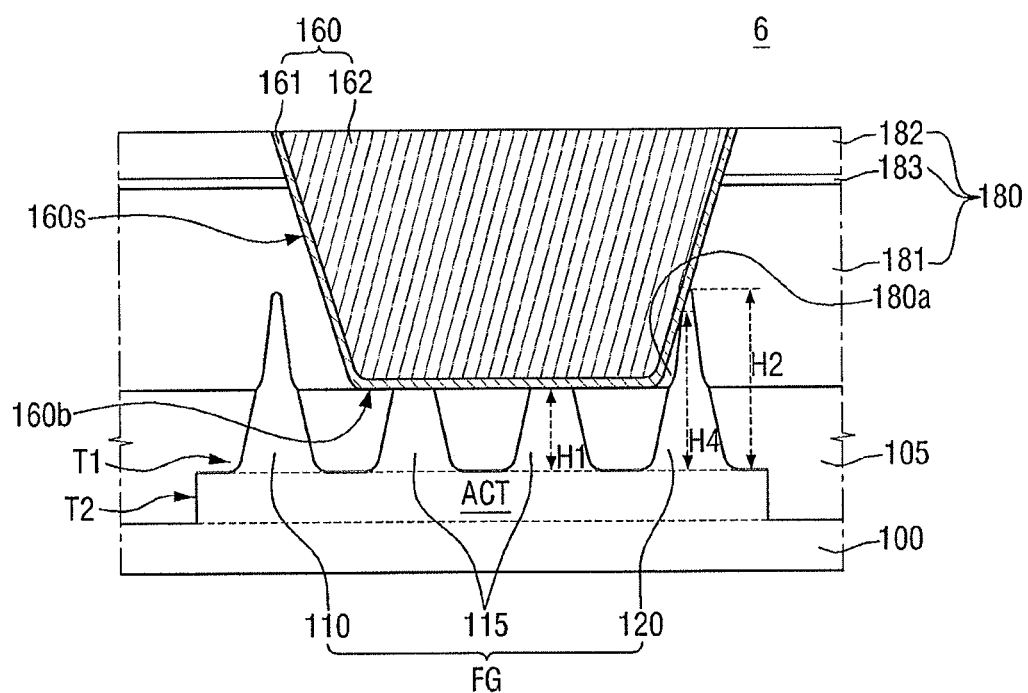
FIG. 10 illustrates a view of a semiconductor device according to an embodiment.

FIG. 10 illustrates a view of a semiconductor device 6 according to an embodiment. For simplicity, the following description will focus on differences with FIGS. 1 through 5A.

Referring to FIG. 10, in the semiconductor device 6 according to an embodiment, a contact 160 may contact a second fin pattern 120.

For example, a sidewall 160s of the contact 160 may contact the second fin pattern 120. Part of the sidewall 160s of the contact 160 may be defined by the second fin pattern 120. Part of the contact 160 may be formed in the second fin pattern 120.

In an embodiment, a bottom surface 160b of the contact 160 may not contact the second fin pattern 120. The bottom surface 160b of the contact 160 may not extend up to the second fin pattern 120.

In the semiconductor device 6 according to the embodiment illustrated in FIG. 10, the bottom surface 160b of the contact 160 may not contact the second fin pattern 120, and the sidewall 160s of the contact 160 may contact the second fin pattern 120.

An insulating layer pattern 180a may be interposed between the second fin pattern 120 which protrudes further upward than a top surface of a field insulating layer 105 and the contact 160. For example, the insulating layer pattern 180a may be interposed between a sidewall of the second fin pattern 120 which protrudes further upward than the top surface of the field insulating layer 105 and the sidewall 160s of the contact 160.

The insulating layer pattern 180a may be, for example, part of an interlayer insulating film 180, an etch-stop layer, or a material remaining on the sidewall of the second fin pattern 120 when spacers 140 are formed.

The insulating layer pattern 180a may be formed on the field insulating layer 105 and may contact the field insulating layer 105.

The sidewall 160s of the contact 160 may contact the second fin pattern 120, and a height h4 from a bottom of a first trench T1 to a topmost end of the insulating layer pattern 180a may be smaller than a height h2 from the bottom of the first trench T1 to a topmost end of the second fin pattern 120 in a region in which the contact 160 intersects the second fin pattern 120.

In FIG. 10, a first fin pattern 110, for example, may not contact the contact 160. In an embodiment, part of a sidewall 160s of the contact 160 may also be defined by the first fin pattern 110.

Figure 11:
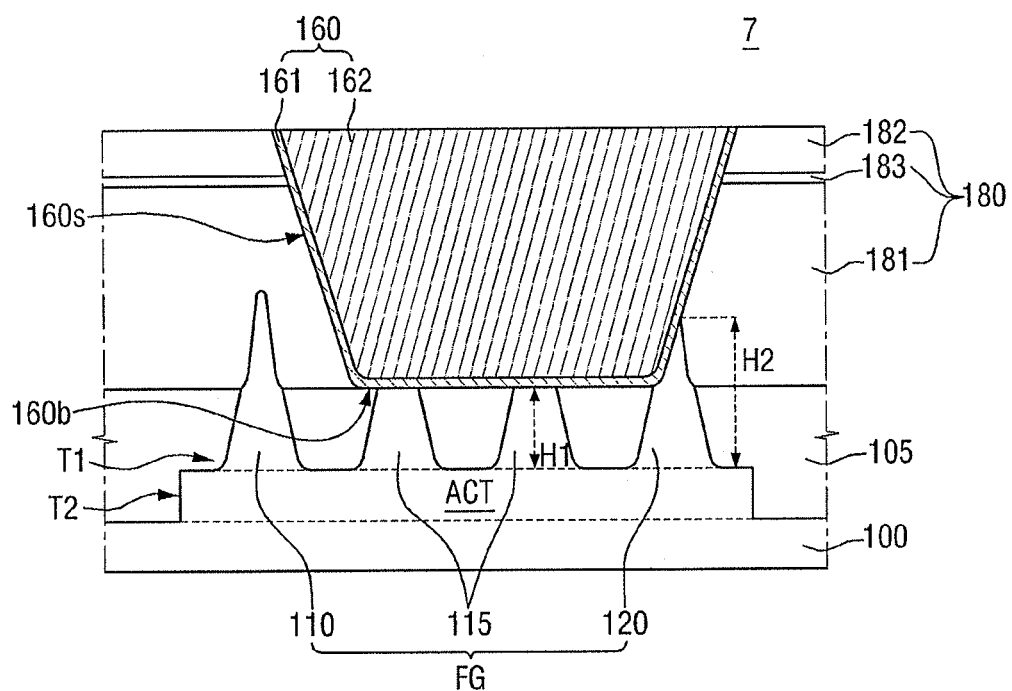
FIG. 11 illustrates a view of a semiconductor device according to an embodiment.

FIG. 11 illustrates a view of a semiconductor device 7 according to an embodiment. For simplicity, the following description will focus on differences with FIG. 10.

Referring to FIG. 11, in the semiconductor device 7 according to an embodiment, a bottom surface 160b of a contact 160 may contact part of a second fin pattern 120. Part of the bottom surface 160b of the contact 160 may extend up to the second fin pattern 120.

In the semiconductor device 7 according to the embodiment illustrated in FIG. 11, the second fin pattern 120 may contact the bottom surface 160b of the contact 160 and a sidewall 160s of the contact 160, and an insulating layer pattern 180a (see FIG. 10) may not be interposed between the second fin pattern 120 and the contact 160.

The contact 160 may contact the second fin pattern 120 and may not penetrate a second part 120b (see FIG. 5) of the second fin pattern 120, and a height h2 from a bottom of a first trench T1 to a topmost end of the second fin pattern 120 in a region in which the contact 160 intersects the second fin pattern 120 may be greater than a height h1 from the bottom of the first trench T1 to a topmost end of each inner fin pattern 115 in a region in which the contact 160 intersects the inner fin patterns 115.

Figure 12:
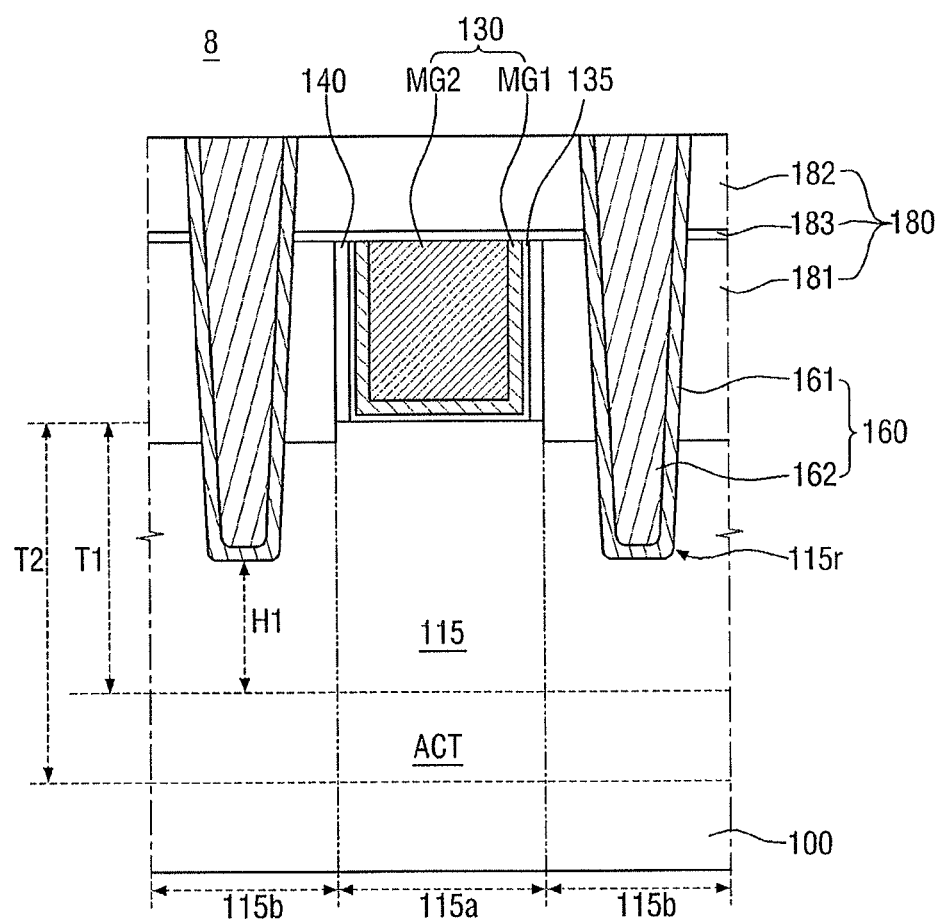
FIG. 12 illustrates a view of a semiconductor device according to an embodiment.
Figure 13:
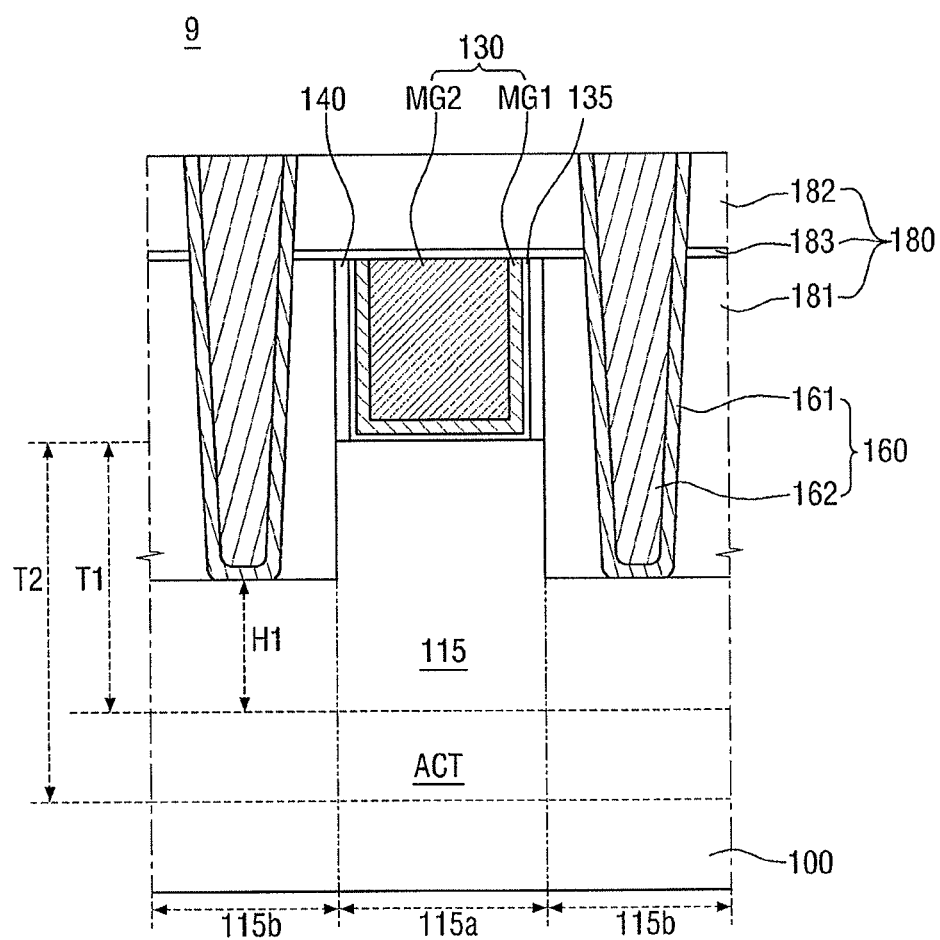
FIG. 13 illustrates a view of a semiconductor device according to an embodiment.

FIG. 12 illustrates a view of a semiconductor device 8 according to an embodiment. FIG. 13 illustrates a view of a semiconductor device 9 according to an embodiment. For simplicity, the following description will focus on differences with FIGS. 1 through 5A.

Referring to FIG. 12, in the semiconductor device 8 according to an embodiment, a top surface of a second part 115b of an inner fin pattern 115 which is located between a spacer 140 and a contact 160 may be more recessed than a top surface of a first part 115a of the inner fin pattern 115 which is overlapped by a gate electrode 130.

The inner fin pattern 115 may be partially etched in the process of forming spacers 140 on sidewalls of the gate electrode 130. For this reason, the top surface of the second part 115b of the inner fin pattern 115 may be lower than the top surface of the first part 115a of the inner fin pattern 115.

Referring to FIG. 13, in the semiconductor device 9 according to an embodiment, part of an interlayer insulating film 180 may be interposed between an inner fin pattern 115, which is overlapped by a gate electrode 130 and spacers 140, and a contact 160.

For example, part of the interlayer insulating film 180 may be interposed between a first part 115a of the inner fin pattern 115, which protrudes further upward than a top surface of a field insulating layer 105, and the contact 160.

To for the contact 160 of the semiconductor device 1 described above with reference to FIGS. 1 through 5A, the interlayer insulating film 180 may be formed, and part of the interlayer insulating film 180 and part of the second part 115b of the inner fin pattern 115 may be removed. Then, the contact 160 may be formed in the removed part.

To form the contact 160 of the semiconductor device 9 according to the embodiment illustrated in FIG. 13, a second part 115b of the inner fin pattern 115 may be etched up to a location near the top surface of the field insulating layer 105 before the formation of a lower interlayer insulating film 181 and the gate electrode 130. Then, the interlayer insulating film 180 may be formed, and a contact hole for forming the contact 160 may be formed. In this case, part of the interlayer insulating film 180 may be interposed between the first part 115a of the inner fin pattern 115 and the contact 160.

Figure 14:
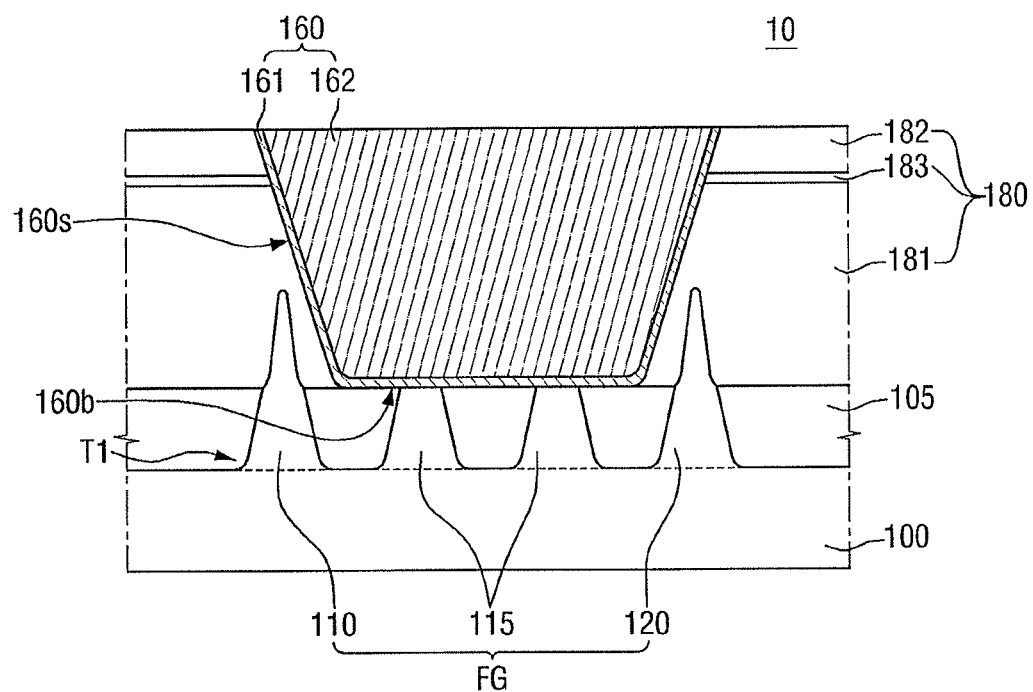
FIG. 14 illustrates a view of a semiconductor device according to an embodiment.

FIG. 14 illustrates a view of a semiconductor device 10 according to an embodiment. For simplicity, the following description will focus on differences with FIGS. 1 through 5A.

Referring to FIG. 14, in the semiconductor device 10 according to an embodiment, a second trench T2 (see FIG. 2) deeper than a first trench T1 may not be formed on both sides of a fin pattern group FG.

In an embodiment, fin patterns 110, 115 and 120 included in the fin pattern group FG may be defined and separated by the first trench T1.

Figure 15:
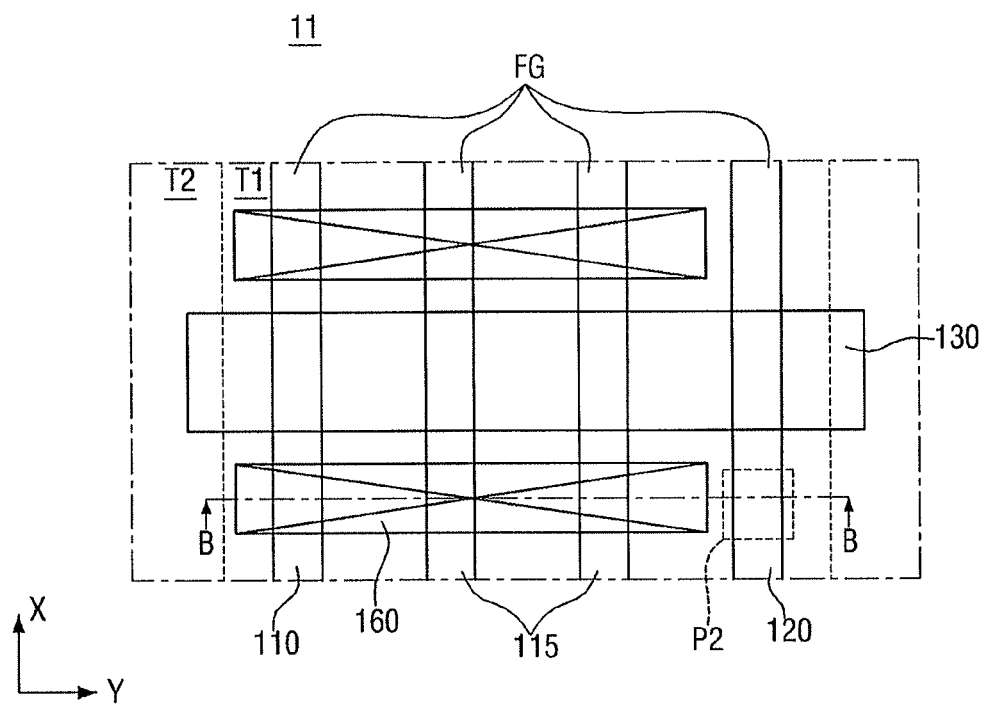
FIG. 15 illustrates layout view of a semiconductor device according to an embodiment.
Figure 16:
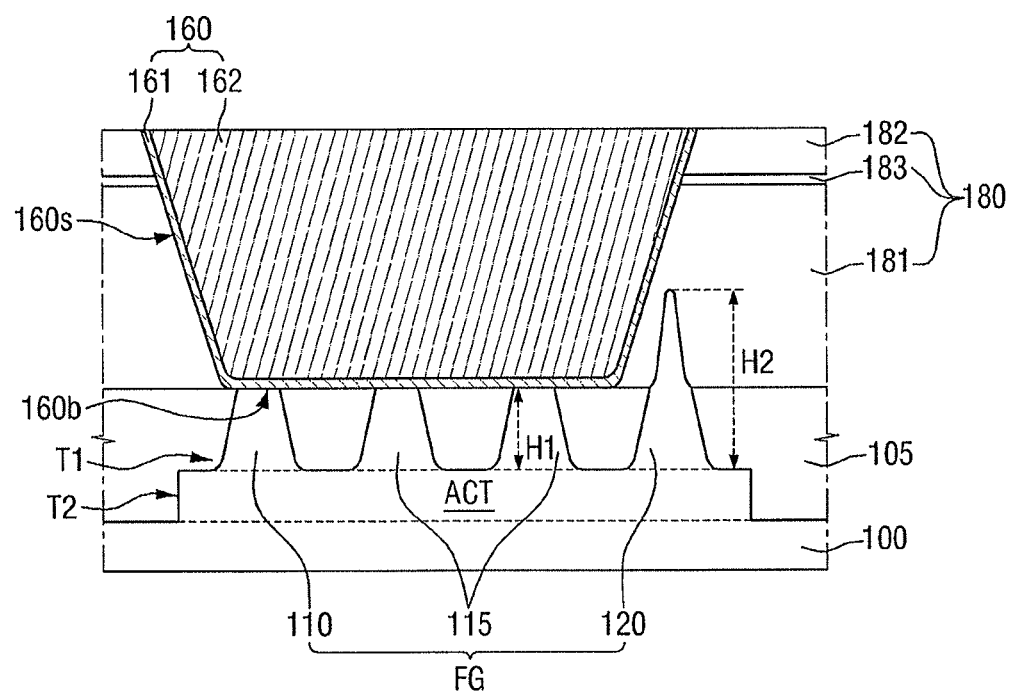
FIG. 16 illustrates a cross-sectional view taken along the line B-B of FIG. 15.

FIG. 15 illustrates a layout view of a semiconductor device 11 according to an embodiment. FIG. 16 illustrates a cross-sectional view taken along the line B-B of FIG. 15. For simplicity, the following description will focus on differences with FIGS. 1 through 5A.

Referring to FIGS. 15 and 16, in the semiconductor device 11 according to an embodiment, a contact 160 may intersect a first fin pattern 110 and may not intersect a second fin pattern 120.

The contact 160 may intersect the first fin pattern 110 located on an outermost side of an active region ACT and may not intersect the second fin pattern 120 located on the other outermost side of the active region ACT. The contact 160 may intersect the first fin pattern 110 which is an outermost fin pattern in a fin pattern group FG and may not intersect the second fin pattern 120 which is another outermost fin pattern in the fin pattern group FG.

A bottom surface 160b of the contact 160 may not contact the second fin pattern 120 and may contact the first fin pattern 110 and inner fin patterns 115. The bottom surface 160b of the contact 160 may extend up to the first fin pattern 110.

In the semiconductor device 11 according to the illustrated in FIG. 15, a height h1 from a bottom of a first trench T1 to a topmost end of each inner fin pattern 115 and a height from the bottom of the first trench T1 to a topmost end of the first fin pattern 110 may be smaller than a height h2 from the bottom of the first trench T1 to a topmost end of the second fin pattern 120.

In FIG. 16, in a region in which the contact 160 intersects the inner fin patterns 115 and a region in which the contact 160 intersects the first fin pattern 110, the entire sidewalls of each inner fin pattern 115 and the entire sidewalls of the first fin pattern 110 may contact a field insulating layer 105.

The contact 160 may penetrate the inner fin patterns 115 and the first fin pattern 110 which protrude further upward than a top surface of the field insulting layer 105.

Figure 17:
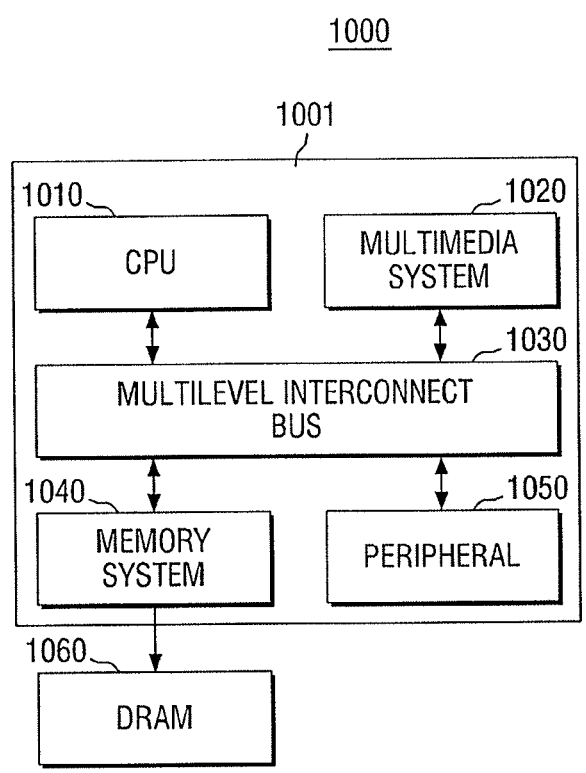
FIG. 17 illustrates a block diagram of a system-on-chip (SoC) system including semiconductor devices according to embodiments.

FIG. 17 illustrates a block diagram of a system-on-chip (SoC) system 1000 including semiconductor devices according to embodiments.

Referring to FIG. 17, the SoC system 1000 includes an application processor 1001 and a dynamic random access memory (DRAM) 1060.

The application processor 1001 may include a central processing unit (CPU) 1010, a multimedia system 1020, a bus 1030, a memory system 1040, and a peripheral circuit 1050.

The CPU 1010 may perform operations needed to drive the SoC system 1000. In some embodiments, the CPU 1010 may be configured as a multi-core environment including a plurality of cores.

The multimedia system 1020 may be used to perform various multimedia functions in the SoC system 1000. The multimedia system 1020 may include a three-dimensional (3D) engine module, a video codec, a display system, a camera system, and a post-processor.

The bus 1030 may be used for data communication among the CPU 1010, the multimedia system 1020, the memory system 1040 and the peripheral circuit 1050. In some embodiments, the bus 1030 may have a multilayer structure. For example, the bus 1030 may be, for example, a multilayer advanced high-performance bus (AHB) or a multilayer advanced extensible interface (AXI).

The memory system 1040 may provide an environment needed for the application processor 1001 to be connected to an external memory (e.g., the DRAM 1060) and operate at high speed. In some embodiments, the memory system 1040 may include a controller (e.g., a DRAM controller) for controlling the external memory (e.g., the DRAM 1060).

The peripheral circuit 1050 may provide an environment needed for the SoC system 1000 to smoothly connect to an external device (e.g., a mainboard), and the peripheral circuit 1050 may include various interfaces that enable the external device connected to the SoC system 1000 to be compatible with the SoC system 1000.

The DRAM 1060 may function as an operating memory needed for the operation of the application processor 1001. In some embodiments, the DRAM 1060 may be placed outside the application processor 1001 as illustrated in the drawing. For example, the DRAM 1060 may be packaged with the application processor 1001 in the form of package on package (PoP).

At least one of the elements of the SoC system 1000 may employ any one of the semiconductor devices 1 through 11 according to the above-described embodiments.

Figure 18:
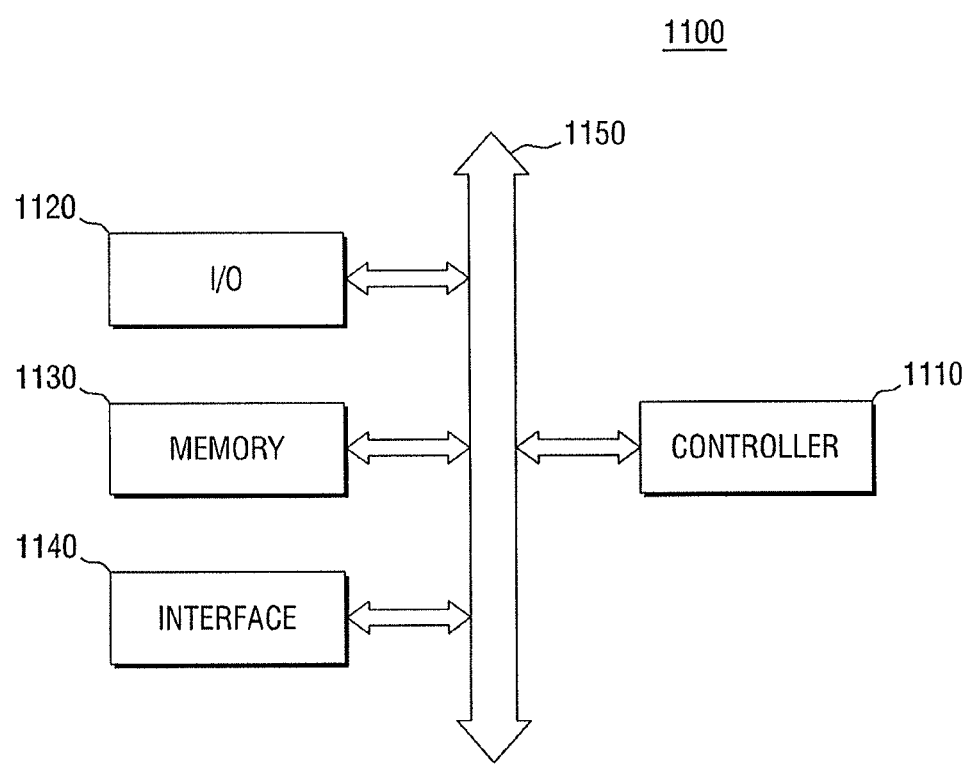
FIG. 18 illustrates a block diagram of an electronic system including semiconductor devices according to embodiments.

FIG. 18 illustrates a block diagram of an electronic system 1100 including semiconductor devices according to embodiments.

Referring to FIG. 18, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include one or more of a microprocessor, a digital signal processor, a microcontroller, or logic devices capable of performing similar functions to those of a microprocessor, a digital signal processor, and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver.

The electronic system 1100 may be an operating memory for improving the operation of the controller 1110, and may further include a high-speed DRAM or SRAM.

Any one of the semiconductor devices 1 through 11 according to the above-described embodiments may be provided in the memory device 1130 or in the controller 1110 or the I/O device 1120.

The electronic system 1100 may be applied to nearly all types of electronic products capable of transmitting and/or receiving information in a wireless environment, such as, for example, a personal data assistant (PDA), a portable computer, a web tablet, a wireless phone, a mobile phone, a digital music player, or a memory card.

Figure 19:
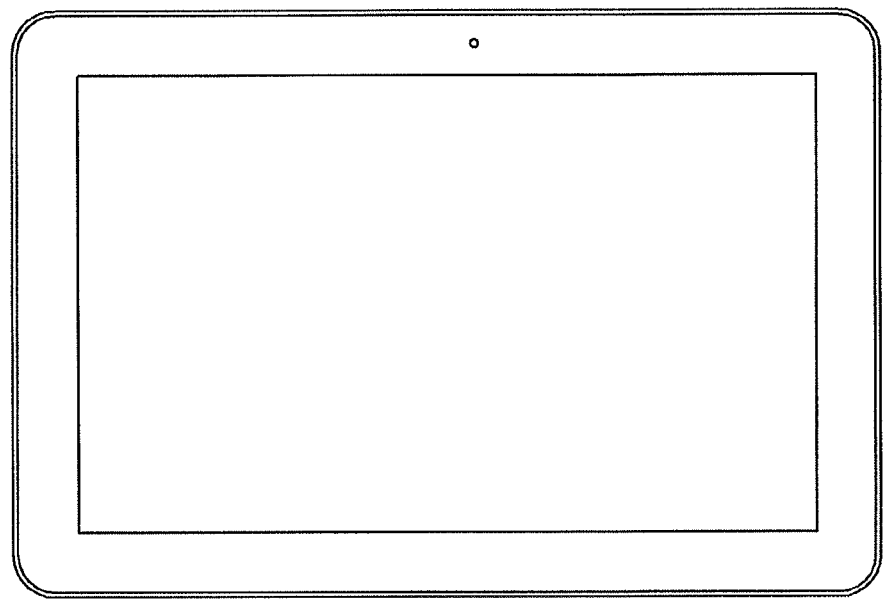
FIGS. 19 through 21 illustrate example semiconductor systems to which semiconductor devices according to embodiments may be applied.
Figure 20:
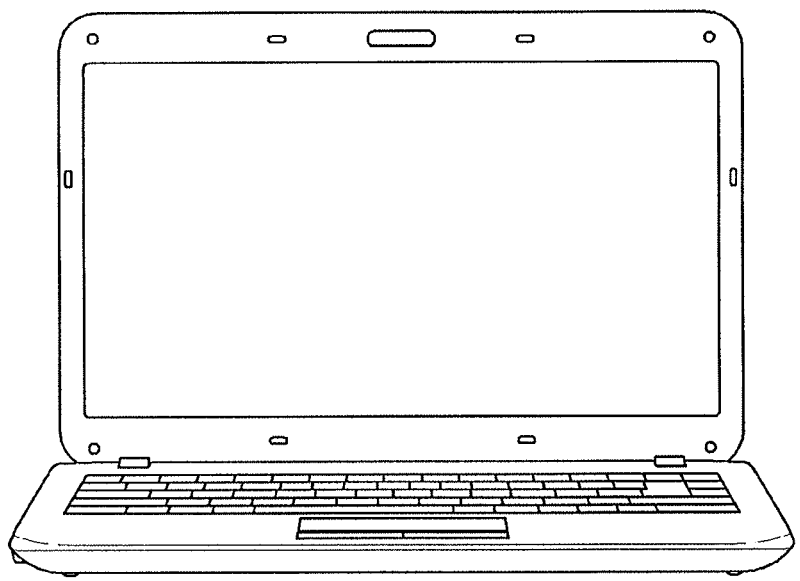
Figure 21:
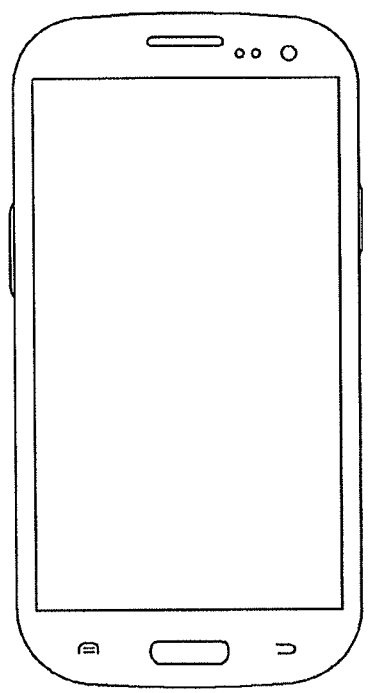

FIGS. 19 through 21 illustrate diagrams of examples of a semiconductor system to which semiconductor devices according to embodiments may be applied.

FIG. 19 illustrates a tablet personal computer (PC) 1200, FIG. 20 illustrates a notebook computer 1300, and FIG. 21 illustrates a smartphone 1400. At least one of the semiconductor devices 1 through 11 according to the embodiments, as set forth herein, may be used in the tablet PC 1200, the notebook computer 1300, and the smartphone 1400.

The semiconductor devices 1 through 11 according to the embodiments, as set forth herein, may also be applied to various IC devices other than those set forth herein.

The tablet PC 1200, the notebook computer 1300, and the smartphone 1400 have been described above as examples of a semiconductor system according to an embodiment.

In some embodiments, the semiconductor system may be provided as, for example, a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, or a digital video player.

By way of summation and review, a multi-gate transistor may be scaled because it uses a 3D channel. The current control capability may be improved without the need to increase the gate length of the multi-gate transistor. Moreover, it may be possible to effectively suppress a short channel effect (SCE) in which an electric potential of a channel region is affected by a drain voltage.

Provided is a semiconductor device that may enhance device operating characteristics by improving operating stability at a high voltage.

In embodiments, a fin type pattern group may have n fin type patterns, and n may be an integer greater than 1. A gate electrode may intersect n fin type patterns in the fin type pattern group, e.g., entirely in the fin type pattern group, and a contact may intersect n−1 or less fin type patterns in the fin type pattern group, e.g., entirely in the fin type pattern group.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    a first fin pattern on a substrate;
    a first protruding portion on the substrate, the first protruding portion being adjacent to the first fin pattern;
    a field insulating film on the substrate, the field insulating film being disposed on at least a portion of sidewalls of the first fin pattern; and
    a contact being on the first fin pattern, the contact being not electrically connected to the first protruding portion, wherein
    the contact is electrically connected to the first fin pattern.

2. The semiconductor device of claim 1, wherein the field insulating film covers an upper surface of the first protruding portion.

3. The semiconductor device of claim 1, wherein the first protruding portion includes a first sidewall defined by a first trench, and a second sidewall defined by a second trench, and
    a depth of the first trench is different from a depth of the second trench.

4. The semiconductor device of claim 1, wherein the contact is in contact with the field insulating film.

5. The semiconductor device of claim 1, further comprising a second fin pattern being adjacent to the first fin pattern on the substrate,
    wherein the field insulating film is disposed on at least a portion of sidewalls of the second fin pattern, and
    the contact is electrically connected to the second fin pattern.

6. The semiconductor device of claim 1, further comprising a second protruding portion being on the substrate and being adjacent to the first fin pattern,
    wherein the first fin pattern is between the first protruding portion and the second protruding portion, and
    wherein the contact is not electrically connected to the second protruding protrusion portion.

7. The semiconductor device of claim 6, wherein the second protruding portion includes a first sidewall defined by a first trench, and a second sidewall defined by a second trench, and
    a depth of the first trench is different from a depth of the second trench.

8. The semiconductor device of claim 6, wherein the field insulating film covers an upper surface of the second protruding portion.

9. The semiconductor device of claim 1, wherein a bottom surface of the contact includes an uneven surface.

10. The semiconductor device of claim 1, further comprising a gate electrode intersecting the first fin pattern,
    wherein the contact is on a side of the gate electrode.

11. The semiconductor device of claim 10, wherein the gate electrode vertically overlaps with at least part of the first protruding portion.

12. A semiconductor device, comprising:
    a protruding portion on a substrate;
    a field insulating film on the substrate, the field insulating film covering an upper surface of the protruding portion;
    an interlayer insulating film on the field insulating film; and
    a contact disposed in the interlayer insulating film and contacting the field insulating film, the contact being not electrically connected to the protruding portion; and a fin pattern electrically connected to the contact and being adjacent to the protruding portion.

13. The semiconductor device of claim 12, wherein the protruding portion includes a first sidewall defined by a first trench, and a second sidewall defined by a second trench, and a depth of the first trench is different from a depth of the second trench.

14. The semiconductor device of claim 12, wherein the field insulating film is disposed on at least a portion of sidewalls of the fin pattern.

15. The semiconductor device of claim 12, further comprising a gate electrode on a side of the contact, wherein the gate electrode vertically overlaps with at least part of the protruding portion.

16. A semiconductor device, comprising:

a first fin pattern and a second fin pattern being on a substrate and formed adjacent to each other;

a first protruding portion on the substrate, the first protruding portion being adjacent to the first fin pattern; and a contact on the first fin pattern and the second fin pattern, the contact being not electrically connected to the first protruding portion and the contact having a bottom surface in a shape of a wave, wherein the contact is electrically connected to the first fin pattern.

17. The semiconductor device of claim 16, wherein the contact is electrically connected to the second fin pattern.

18. The semiconductor device of claim 16, further comprising a field insulating film on the substrate, wherein the field insulating film covers an upper surface of the first protruding portion.

19. The semiconductor device of claim 16, further comprising a second protruding portion being adjacent to the second fin pattern, wherein the contact is not electrically connected to the second protruding portion.

* * * * *